US006489767B1

(12) United States Patent
Prado et al.

(10) Patent No.: US 6,489,767 B1
(45) Date of Patent: Dec. 3, 2002

(54) APPARATUS FOR AND METHOD OF SINGLE-SIDED MAGNETIC RESONANCE IMAGING WITH PALM-SIZE PROBE

(75) Inventors: Pablo J. Prado, San Diego, CA (US); Bernhard Blümich, Aachen (DE)

(73) Assignee: Quantum Magnetics, Inc., San Diego, CA (US)

( * ) Notice: Subject to any disclaimer, the term of this patent is extended or adjusted under 35 U.S.C. 154(b) by 105 days.

(21) Appl. No.: 09/655,739

(22) Filed: Sep. 6, 2000

(51) Int. Cl.[7] .................................................. G01V 3/00
(52) U.S. Cl. ........................ 324/318; 324/309; 324/322
(58) Field of Search ................................ 324/309, 318, 324/320, 322, 321, 319, 307; 600/410

(56) References Cited

U.S. PATENT DOCUMENTS

| 4,296,378 | A | | 10/1981 | King ............................ 324/313 |
| 4,471,306 | A | | 9/1984 | Edelstein et al. ............ 324/309 |
| 4,542,343 | A | | 9/1985 | Brown ......................... 324/307 |
| 4,656,425 | A | | 4/1987 | Bendel .......................... 324/309 |
| 4,703,270 | A | | 10/1987 | Hall et al. ................... 324/309 |
| 4,987,368 | A | | 1/1991 | Vinegar ........................ 324/303 |
| 5,390,673 | A | * | 2/1995 | Kikinis ......................... 600/410 |
| 5,517,118 | A | | 5/1996 | Crowley et al. ............. 324/309 |
| 5,631,561 | A | * | 5/1997 | Stetter .......................... 324/322 |
| 5,731,704 | A | * | 3/1998 | Schnur et al. ............... 324/320 |
| 5,744,960 | A | | 4/1998 | Pulyer .......................... 324/320 |
| 5,767,675 | A | | 6/1998 | Crowley et al. ............. 324/309 |
| 5,959,454 | A | * | 9/1999 | Westphal et al. ............ 324/320 |

OTHER PUBLICATIONS

B. Blumich et al., "The NMR–MOUSE Construction, Excitation, and Applications", Magnetic Resonance Imaging, vol. 16, Nos. 5/6. 1998 pp. 479 through 484.*
Rokitta et al., "Portable nuclear magnetic resonance imaging system", Review of Scientific Instruments col. 71, No. 11 Nov. 2000 pp. 4257 through 4262.*
"The NMR–MOUSE a Mobile Universal Surface Explorer" Article by G. Eidmann; R. Savelsberg; P. Blumler; and B. Blumich Journal of Magnetic Resonance Series A 122 pp. 104–109, 1996.*
G. Eidmann, R. Savelsberg, P. Blumler, and B. Blumich "The NMR MOUSE, a Mobile Universal Surface Explorer" Journal of Magnetic Resonance, Series A 122, 1996 pp. 104–109.*
B. Blümich et al., "The NMR–Mouse: Construction, Excitation, and Applications," Magnetic Resonance Imaging, vol. 16, Nos. 5/6, pp. 479–484 (1998).

* cited by examiner

*Primary Examiner*—Edward Lefkowitz
*Assistant Examiner*—Tiffany A. Fetzner
(74) *Attorney, Agent, or Firm*—The Maxham Firm

(57) ABSTRACT

An apparatus for and a method of single-sided MRI with a palm-sized probe. The probe includes a planar permanent magnet having a gap between the north and south poles of the magnet. Positioned in the gap are an RF coil and a pair of gradient coils. The gradient coils are located on either side of the RF coil. The probe further includes an RF tuning circuit and a gradient input. In use, the pair of gradient coils produce a controlled magnetic field gradient over the field of view thereby improving image resolution.

14 Claims, 4 Drawing Sheets

APPARATUS FOR AND METHOD OF SINGLE-SIDED MAGNETIC RESONANCE IMAGING WITH PALM-SIZE PROBE

BACKGROUND OF THE INVENTION

1. Field of the Invention

The present invention relates generally to the field of magnetic resonance imaging (MRI) and pertains more specifically to an apparatus for and a method of single-sided MRI with a palm-sized probe.

2. Discussion of the Prior Art

Single-sided or remotely positionable MRI devices have many advantages which stem primarily from the fact they can produce images of in situ specimens without requiring that the device surround and confine the specimen being imaged. Fields of study include a wide range of heterogeneous specimens with diverse compositions such as polymers, epoxies, biological tissues, food products, construction materials, and porous media. By virtue of being single-sided, however, they also have unique characteristics which must be taken into consideration. For instance, a single-sided MRI device generates an inhomogeneous magnetic field. This fact, alone, has a very significant effect on how the device is designed and how it operates.

In order to obtain useable images of in situ tissue, for example, with a single-sided MRI device, there needs to be a defined measurement region within the inhomogeneous magnetic field which is specifically configured for nuclear magnetic resonance (NMR) imaging. More specifically, it is the measurement region which coincidently covers the tissue that is to be imaged during the operation of the MRI device. Although the specific configuration for the measurement region can be varied somewhat according to the desires of the operator, for medical and industrial applications the measurement region will typically have a nearly flat planar configuration. Further, the measurement region will typically be relatively thin.

As is well known to skilled artisans, MRI is a diagnostic apparatus that is extensively used in the medical field to non-invasively image internal biological tissue. As is also well known, MRI relies on the magnetic resonance of nuclei, and the fact that when nuclei are placed in the environment of a strong external magnetic field $B_0$ they will each assume a discrete energy state. Further, NMR takes advantage of the fact that while nuclei are influenced by an external magnetic field, radio frequency (RF) energy will induce changes in their energy states to generate signals which are characteristic of the nuclear spin and its surroundings. The RF radiation which is most effective for inducing such changes has a particular frequency (known as the Larmor frequency) which depends on the magnitude of the magnetic field at the location of the nucleus.

One advantage of a small portable MRI system is that it provides a non-destructive mobile scanning tool that renders information in situ which would otherwise not be attainable. One disadvantage of the small portable models is that they conventionally provide a narrow field of view requiring frequent repositioning of the probe.

Ideally, a portable MRI system would have a lower cost and a higher productivity than conventional systems. With a system of this type, system performance can be enhanced. A primary purpose of the present invention is to solve this need and provide further, related advantages.

SUMMARY OF THE INVENTION

An apparatus for and a method of single-sided MRI with a palm-sized probe is disclosed. The probe includes a planar permanent magnet having a gap between the north and south poles of the magnet. Positioned in the gap are an RF coil and a pair of gradient coils. The gradient coils are located on either side of the RF coil. The probe further includes an RF tuning circuit and a gradient input. In use, the pair of gradient coils produce a controlled magnetic field gradient over the field of view thereby improving image resolution.

BRIEF DESCRIPTION OF THE DRAWING

The above and other objects and advantages of the present invention will be more readily appreciated from the following detailed description when read in conjunction with the accompanying drawing, wherein.

DETAILED DESCRIPTION OF THE PREFERRED EMBODIMENTS

Figure 1:
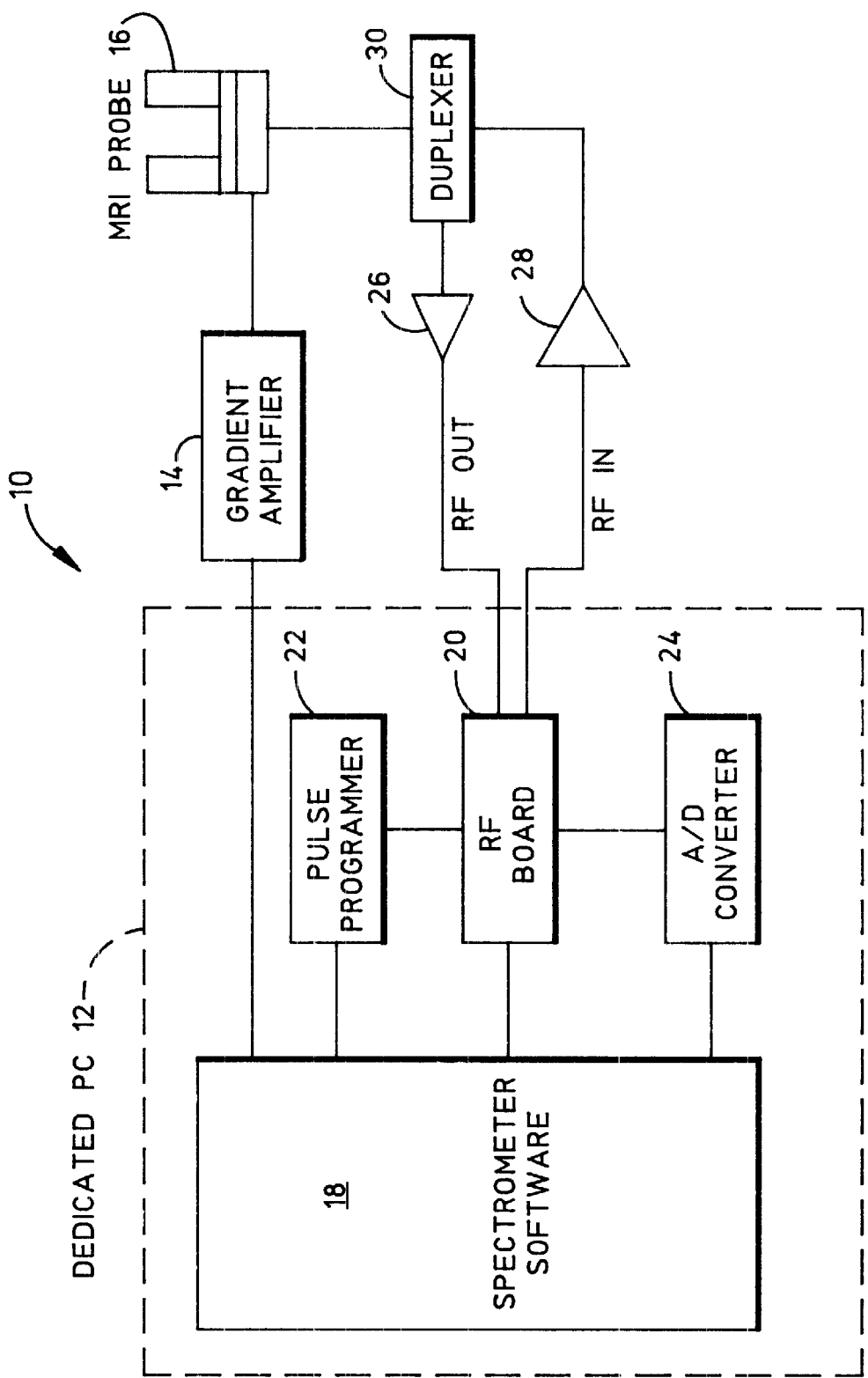
FIG. 1 is a block diagram of a spectrometry system including a computer, a gradient amplifier, and an MRI probe.

Turning first to FIG. 1, a block diagram of a spectrometry system 10 including a computer 12, a gradient amplifier 14, and an MRI probe 16 is shown. The heart of the system is the computer which can be any general purpose computer modified with dedicated software and hardware or the computer can be an entirely dedicated computer. For the user, the computer is connected to an output device (not shown) such as a display monitor and at least one input device (not shown) such as a keyboard. The computer will include spectrometer software 18 which, among other things, controls the system, generates a user interface, and provides the results. The computer will further include an RF board 20 which both drives an RF coil (not shown) of the probe 16 and receives readings back from the probe. The RF board is controlled at least in part by a pulse programmer 22 which is included in the computer. The output of the RF board is processed by an analog-to-digital (A/D) converter 24 which may also be included in the computer. The computer, RF board, pulse programmer, and A/D converter could all be discrete devices but it is preferred that they be combined for greater portability. Connected to the computer are the gradient amplifier, an RF transmitter amplifier 26 (RF out), and an RF receiver amplifier 28 (RF in). The RF amplifiers are in turn connected to a duplexer 30. The gradient amplifier and the duplexer are finally connected to the probe.

Figure 2:
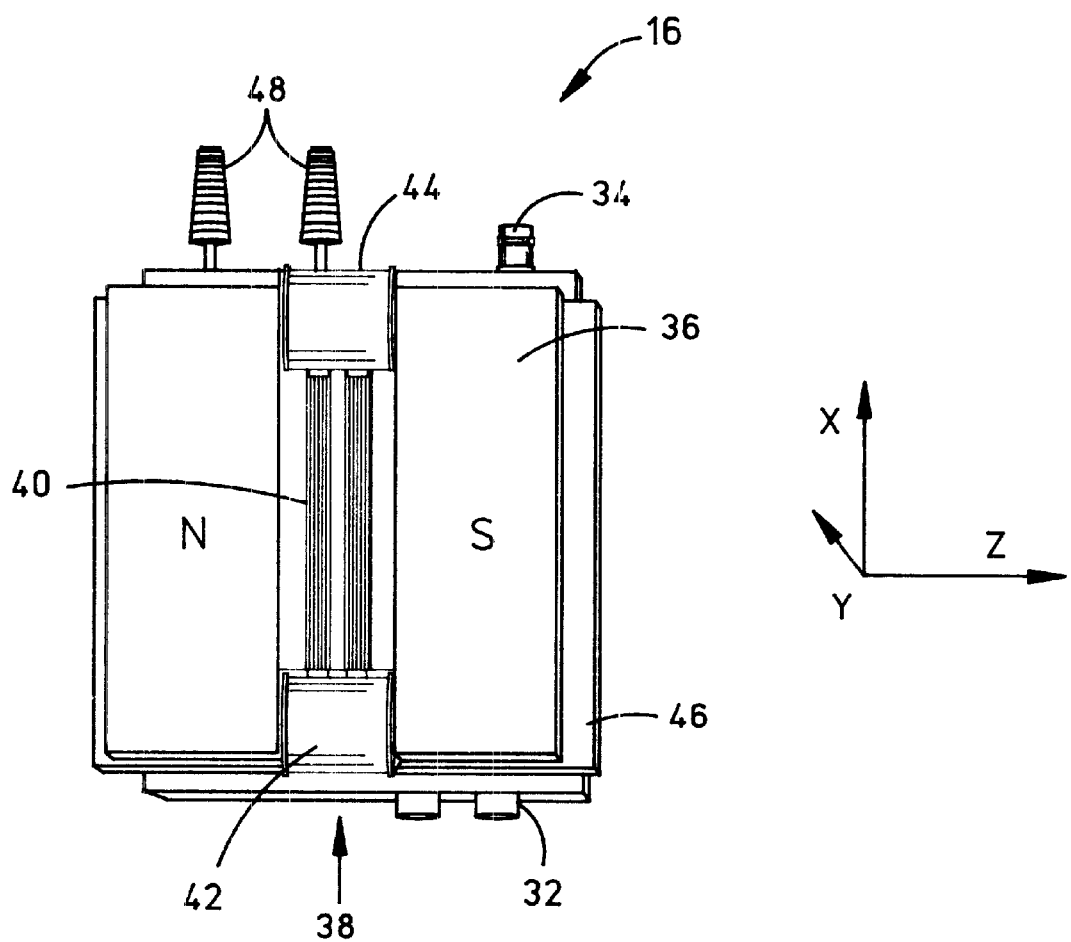
FIG. 2 is a diagrammatic top view of a preferred embodiment of the probe constructed according to an embodiment of the present invention, as shown in FIG. 1.

With reference to FIG. 2, a diagrammatic top view of a preferred embodiment according to the present invention of the probe 16 of FIG. 1 is shown. The gradient amplifier 14 of FIG. 1 is connected to a gradient input 32 of the probe and the duplexer 30 of FIG. 1 is connected to an RF input and output (in/out) receptacle 34 of the probe. The probe includes at least one anti-parallel permanent magnet 36 having a gap 38 between the north (N) and south (S) poles of the magnet. Positioned in the gap are an RF coil 40 and a pair of gradient coils 42, 44. The gradient coils are located on either side of the RF coil. In the preferred embodiment, the magnets are placed on a yoke 46. Fine adjustment of the RF coil is provided by an RF tuning circuit 48. For reference purposes, a Cartesian coordinate system is provided with positive x being up, positive y being out, and positive z being right. Although the relative position of the components of the probe are substantially set, the actual shapes and dimensions of the components may vary.

Figure 3A:
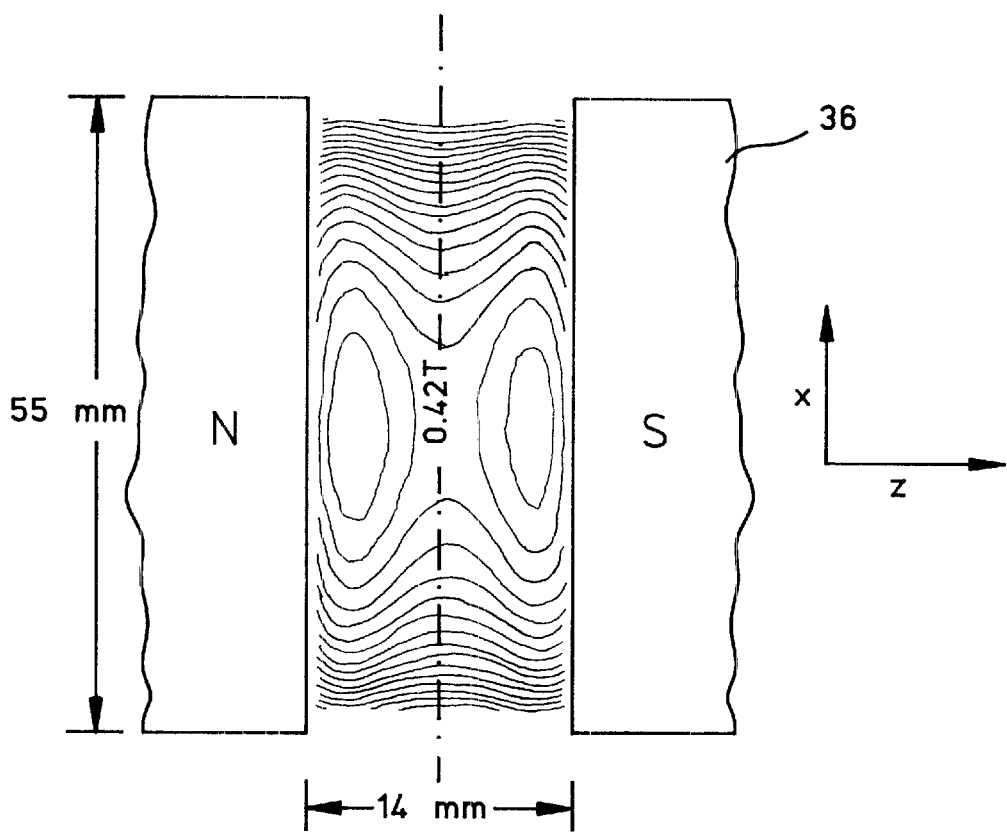
FIG. 3A is a graph of the contour lines for the z-component of the field $B_0$ for the magnet of FIG. 2.
Figure 3B:
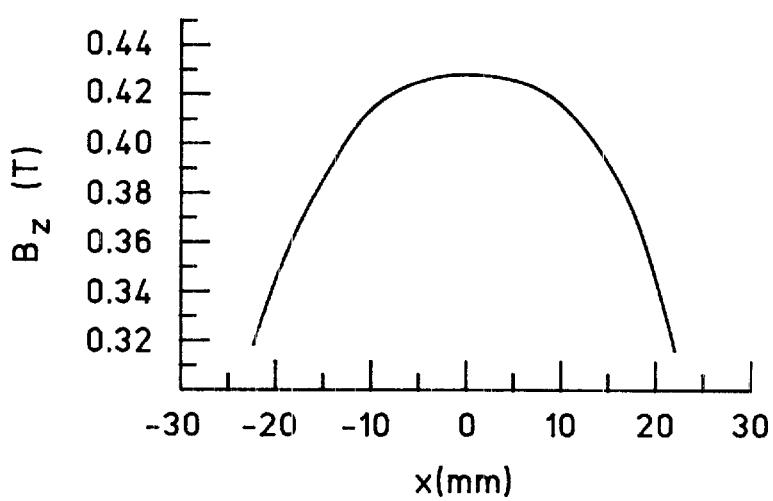
FIG. 3B is a graph of the variation of the z-component of the field $B_0$ along the center of the gap (x-direction) for the magnet of FIG. 2.

FIGS. 3A and 3B will now be discussed. Under normal operation, the magnet 36 of FIG. 2 is used to generate a static polarizing field $B_0$ which is directed from the north pole to the south pole, that is, in the positive z-direction. The RF coil 40 of FIG. 2 is used to produce the RF excitation field $B_1$ which radiates predominantly y-direction components, that is, perpendicular to the static field $B_0$. In FIG. 3A, a graph of the contour lines for the z-component of the field $B_0$ is shown. FIG. 3B shows a graph of the variation of the z-component of the field $B_0$ along the center of the gap, that is, in the x-direction. One of ordinary skill in the art will recognize that this field is highly inhomogeneous with a monotonic strength decrease toward the end of the magnet gap. The result is a relatively small measurement region or field of view.

Figure 4A:
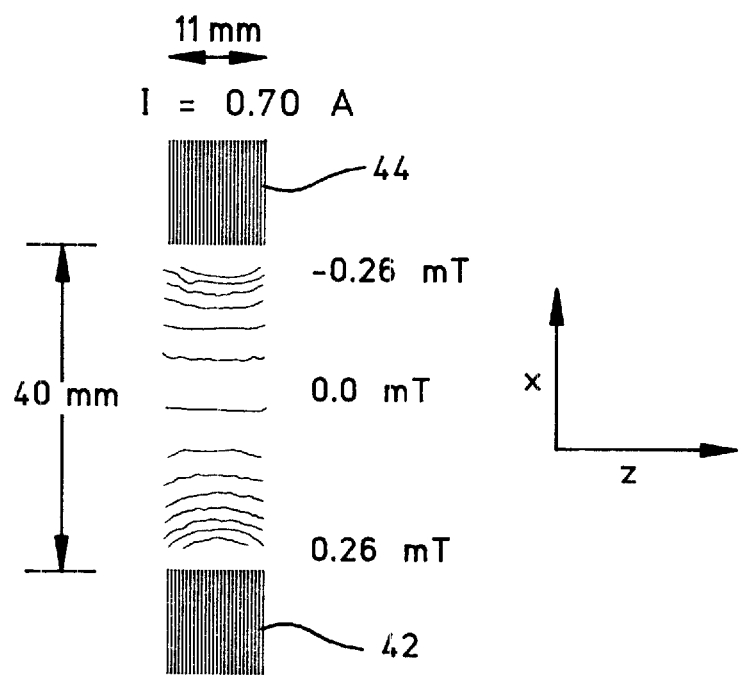
FIG. 4A is a graph of the contour lines for the z-component of the field $B_g$ for the gradient coils of FIG. 2.
Figure 4B:
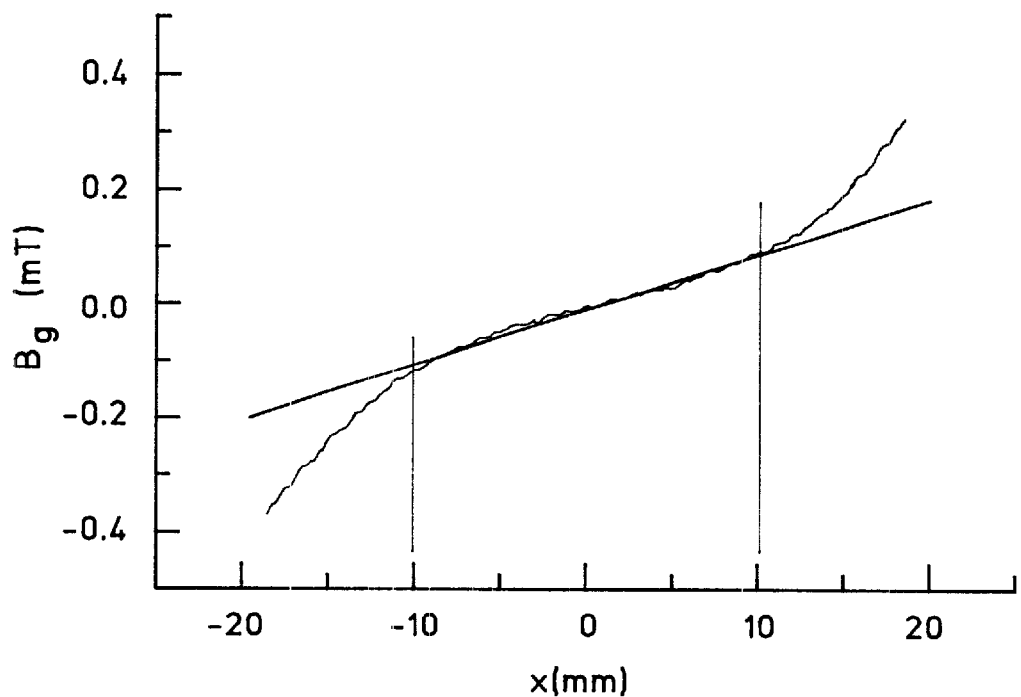
FIG. 4B is a graph of the variation of the field $B_g$ for the gradient coils, along the center of the gap for the probe of FIG. 2.

With reference to FIGS. 4A and 4B, during operation, the gradient coils 42, 44 of FIG. 2 are wired anti-parallel and are used to generate a field $B_g$ parallel to the field $B_0$. Given that the probe is designed to be portable and is usually repositioned by user hand manipulation, the winding specification of the gradient coils was chosen to maintain a low power threshold. This increases user safety and decreases the size of the gradient amplifier 14 of FIG. 1. The length and position of the gradient coils was chosen to optimize image resolution. In FIG. 4A, a graph of the contour lines for the z component of the field $B_g$ is shown. FIG. 4B shows a graph of the variation of the field $B_g$ along the center of the gap in the probe 16 of FIG. 2. One of ordinary skill in the art will recognize that this field has a nearly constant field gradient over the field of view. Due to the highly inhomogeneous underlying static fields resulting in short lived signals, a spin-echo phase encoding sequence was used for the imaging procedure. In addition to an extended field of view, the probe achieves fine resolution.

One of ordinary skill in the art will realize that the dimensions and field strength values listed in FIGS. 3A–4B are for demonstration purposes only. The actual dimensions and values will depend on the particular application. While the invention has been illustrated and described by means of specific embodiments, it is to be understood that numerous changes and modifications may be made therein without departing from the spirit and scope of the invention as defined in the appended claims and equivalents thereof.

What is claimed is:

1. A palm-size probe for single-sided magnetic resonance imaging comprising:
    at least one permanent magnet having a gap between the poles for generation of a static polarizing field;
    a radio frequency coil positioned in the gap for the generation of an excitation field; and
    at least one pair of gradient coils positioned in the gap on either side of the radio frequency coil for the generation of a gradient field,
    wherein the probe is palm-size and produces single-sided magnetic resonance imaging.

2. The probe as defined in claim 1, further comprising:
    a yoke under the magnet;
    a radio frequency tuning circuit and a radio frequency input/output receptacle each connected to the radio frequency coil; and
    a gradient input connected to the gradient coils.

3. The probe as defined in claim 1, further comprising a yoke under the magnet.

4. The probe as defined in claim 1, further comprising a radio frequency tuning circuit and a radio frequency input/output receptacle each connected to the radio frequency coil.

5. The probe as defined in claim 1, further comprising a gradient input connected to the gradient coils.

6. A system for single-sided magnetic resonance imaging comprising;
    a computer for controlling the system;
    a gradient amplifier connected to the computer;
    a palm-size probe connected to the gradient amplifier;
    at least one permanent magnet having a gap between the poles for generation of a static polarizing field;
    a radio frequency coil positioned in the gap for the generation of an excitation field; and
    at least one pair of gradient coils positioned in the gap on either side of the radio frequency coil for the generation of a gradient field, wherein said gradient coils are positioned within the probe,
    wherein the system produces single-sided magnetic resonance imaging.

7. The system as defined in claim 6, wherein the computer comprises spectrometer software that at least in part controls the gradient amplifier.

8. The system as defined in claim 7, wherein the computer further comprises:
    a radio frequency board for controlling a radio frequency sub-system;
    a pulse programmer connected to the radio frequency board; and
    an analog-to-digital converter connected to the radio frequency board;
    wherein each of the radio frequency board, the pulse programmer, and the analog-to-digital converter are in turn connected to and controlled by the spectrometer software.

9. A method of single-sided magnetic resonance imaging using a palm-size probe, the method comprising the steps of:
    generating a static polarizing field with at least one permanent magnet having a gap between the poles;
    generating an excitation field with a radio frequency coil positioned in the gap; and
    generating a gradient field with at cast one pair of gradient coils positioned in the probe in the gap on either side of the radio frequency coil,
    wherein the probe is palm-size and produces single-sided magnetic resonance imaging.

10. A method of single-sided magnetic resonance imaging, the method comprising the step of:
    generating a gradient field within a palm-size probe. wherein said probe comprises at least one permanent magnet having a gap between the poles for generation of a static polarizing field and a radio frequency coil positioned in the gap for the generation of an excitation field.

11. A palm-size probe for single-sided magnetic resonance imaging comprising:
- at least one permanent magnet having a gap between the poles for generation of a static polarizing field;
- a radio frequency coil positioned in the gap for the generation of an excitation field; and
- means for generating a gradient field positioned in the gap,
- wherein the probe is palm-size and produces single-sided magnetic resonance imaging.

12. The probe as defined in claim 11, further comprising a yoke under the magnet.

13. The probe as defined in claim 11, further comprising a radio frequency tuning circuit and a radio frequency input/output receptacle each connected to the radio frequency coil.

14. The probe as defined in claim 11, further comprising a gradient input connected to the means for generating a gradient field.

* * * * *